(12) United States Patent
Wu

(10) Patent No.: US 10,426,058 B2
(45) Date of Patent: Sep. 24, 2019

(54) COLD PLATE ASSEMBLY FOR ELECTRICAL CABINET

(71) Applicants: Johnson Controls Technology Company, Milwaukee, WI (US); Johnson Controls Air Conditioning and Refrigeration (Wuxi) Co., Ltd., Wuxi (CN); York (Wuxi) Air Conditioning and Refrigeration Co., Ltd., Wuxi (CN)

(72) Inventor: Zhuoqi Wu, Wuxi (CN)

(73) Assignees: Johnson Controls Technology Company, Auburn Hills, MI (US); York (Wuxi) Air Conditioning and Refridgeration Co., LTD., Wuxi, Jiangsu (CN); Johnson Controls Air Conditioning and Refridgeration (Wuxi) Co., Ltd., Wuxi, Jiangsu (CN)

( * ) Notice: Subject to any disclaimer, the term of this patent is extended or adjusted under 35 U.S.C. 154(b) by 0 days.

(21) Appl. No.: 15/654,457

(22) Filed: Jul. 19, 2017

(65) Prior Publication Data

US 2018/0027697 A1 Jan. 25, 2018

(30) Foreign Application Priority Data

Jul. 22, 2016 (CN) .................... 2016 2 0778766 U

(51) Int. Cl.
*H05K 7/20* (2006.01)
*H01L 23/473* (2006.01)
*F28D 1/03* (2006.01)

(52) U.S. Cl.
CPC ....... *H05K 7/20254* (2013.01); *H01L 23/473* (2013.01); *H05K 7/20509* (2013.01); *H05K 7/20927* (2013.01); *F28D 1/0375* (2013.01)

(58) Field of Classification Search
CPC .................................................. H05K 7/20254
USPC ......................................................... 174/16.3
See application file for complete search history.

(56) References Cited

U.S. PATENT DOCUMENTS

| 5,453,911 A | 9/1995 | Wolgemuth et al. |
| 6,434,003 B1* | 8/2002 | Roy .................... H05K 7/20927 165/104.22 |
| 2005/0128705 A1* | 6/2005 | Chu ...................... H01L 23/473 361/699 |

(Continued)

FOREIGN PATENT DOCUMENTS

WO 2016069414 A1 5/2016

OTHER PUBLICATIONS

PCT International Search Report & Written Opinion for Application No. PCT/US2017/043156 dated Sep. 5, 2017, 16 pgs.

*Primary Examiner* — Stanley Tso
(74) *Attorney, Agent, or Firm* — Fletcher Yoder, P.C.

(57) ABSTRACT

Embodiments of the present disclosure are directed to a cold plate assembly for an electrical cabinet, including: a main body part, a sealing part, and a mounting part. The main body part is provided with a channel for the circulation of a liquid cooling medium and an accommodation groove located on a first upper surface of the main body part. The sealing part is disposed in the accommodation groove and the mounting part is located above the sealing part. A lower surface of the mounting part faces the main body part, and a second upper surface of the mounting part is configured to mount an electronic device to be cooled.

5 Claims, 6 Drawing Sheets

(56) References Cited

U.S. PATENT DOCUMENTS

2010/0071396 A1    3/2010  Jadric et al.
2014/0305619 A1  10/2014  Wright et al.
2016/0128236 A1*  5/2016  Pietrantonio .......... H05K 7/209
                                                               361/702

* cited by examiner

COLD PLATE ASSEMBLY FOR ELECTRICAL CABINET

CROSS-REFERENCE TO RELATED APPLICATION

This application claims priority to and the benefit of Chinese Utility Model Application No. 201620778766.7, filed Jul. 22, 2016, entitled "COLD PLATE ASSEMBLY FOR ELECTRICAL CABINET," which is herein incorporated by reference in its entirety for all purposes.

BACKGROUND

The present disclosure relates to the field of cooling devices, and in particular to a cold plate assembly for an electrical cabinet.

With the development of power electronic technology, the power of electronic devices is increasingly higher, and the volumes thereof become increasingly smaller. In order to efficiently cool the power electronic devices in electrical cabinets, the application of a heat dissipation mode utilizing a liquid cooling medium and a cold plate is becoming more common.

As shown in FIG. 1, an existing power electronic device is typically mounted on a cold plate 13 made of copper. In a liquid cooling mode, heat generated by the power electronic device is transferred from a bottom of the substrate, through the cold plate 13, and to a liquid cooling medium flowing through a channel in the cold plate 13. The liquid cooling medium is cooled again by a heat exchanger or the like external to the cold plate 13. Unfortunately, the cold plate 13 is made of copper, and thus the cost is relatively high. In addition, most existing power electronic devices have size requirements, which may increase costs of the cold plate 13. For example, the power electronic device may include an IGBT 11 (e.g., Insulated Gate Bipolar Transistor) mounted to the cold plate 13 by a fastener 12 and a silicon controlled rectifier element 14 mounted on the cold plate 13 by a fastener 15. In cases where the number of power electronic devices to be installed is relative large, the mounting surface of the cold plate 13 is also relatively large, such that an overall height of the electronic devices is relatively small. Because the cold plate 13 is made of copper, reducing the height of the electronic devices is relatively difficult and may result in a finished product having reduced efficiency.

As shown in FIG. 2, another existing cooling system includes a channel for the inflow, circulation, and outflow of a liquid cooling medium. For example, a liquid inlet and a liquid outlet are positioned on a cold plate 21, where a substrate of a power electronic device 24 is mounted. A sealing ring 22 is utilized to form a seal between the cold plate 21 and the power electronic device 24. The liquid cooling medium flows proximate to a bottom of the substrate of the power electronic device 24 through the channel, the liquid outlet, and the liquid inlet of the cold plate 21, thereby directly contacting the bottom of the substrate to remove heat generated by the power electronic device 24. In some embodiments, the power electronic device 24 is mounted to the cold plate 21 through a bolt 23. Further, the liquid cooling medium may be cooled by the heat exchanger or the like external to the cold plate 21. The illustrated embodiment of FIG. 2 includes increased heat exchange performance when compared to the embodiment of FIG. 1 because the cold plate 21 can be made of a relatively inexpensive material, thereby reducing the cost of the cold plate 21. However, the cold plate 21 having the structure of FIG. 2 is not suitable for the power electronic device 24 in which the bottom of the substrate is not a sealed structure.

Accordingly, it is desirable to provide a cold plate assembly for an electrical cabinet to at least partially solve the above problems.

SUMMARY

A series of simplified concepts are introduced in the summary of the present disclosure, and this will be further illustrated in detail in specific embodiments. The summary of the present disclosure is not intended to limit the features of the claimed technical solutions, and is not intended to determine the scope of protection of the claimed technical solutions.

In order to at least partially solve the above problems, the present disclosure relates to a cold plate assembly for an electrical cabinet, where the cold plate assembly includes a main body part, where the main body part is provided with a channel for the circulation of a liquid cooling medium and an accommodation groove located on an upper surface of the main body part; a sealing part, where the sealing part is accommodated in the accommodation groove; and a mounting part, where the mounting part is located above the sealing part, the lower surface of the mounting part faces to the main body part, and the upper surface of the mounting part is used for mounting the electronic device to be cooled.

The cold plate assembly for the electrical cabinet according to the present disclosure is provided with the main body part, the sealing part, and the mounting part, the main body part is provided with the channel for the inflow, circulation, and outflow of the liquid cooling medium and the channel for placing the sealing part. The mounting part is used for mounting a power electronic device, so that the cost of the main body part can be reduced, and the cold plate assembly can also be applied to power electronic devices with non-sealed structures on the bottoms.

In some embodiments, the main body part includes at least one plate-like component.

In some embodiments, the mounting part includes at least one plate-like component.

In some embodiments, the sealing part includes at least one sealing ring.

In some embodiments, the main body part is made of a material containing aluminum and/or plastic.

In some embodiments, a flow channel is formed in the upper surface of the main body part, and the flow channel communicates with the channel through a liquid outlet and a liquid inlet.

In some embodiments, the mounting part is made of copper.

BRIEF DESCRIPTION OF THE DRAWINGS

The following drawings illustrate embodiments of the present disclosure and are used herein as to understand the present disclosure. In the drawings, embodiments of the present disclosure and a description thereof are given to explain the principle of the present disclosure. In the drawings.

DETAILED DESCRIPTION

In the following discussion, details are given to provide a more intensive understanding of the present disclosure. However, it will be appreciated by those skilled in the art that embodiments of the present disclosure may be implemented without one or more of these details. In a particular example, some technical features known in the art are not described in detail in order not to obscure the embodiments of the present disclosure. It should be noted that the terms "up," "down," "front," "back," "left," "right," and similar expressions used herein are for illustrative purposes only, rather than limiting.

Words such as "first" and "second" cited in the present disclosure are merely identifiers and do not have any other meaning, such as a particular order. Moreover, for example, the term "first component" itself does not imply the existence of a "second component," and the term "second component" itself does not imply the existence of a "first component."

The present disclosure relates to a cold plate assembly for an electrical cabinet, the cold plate assembly includes a main body part 100, a sealing part, and a mounting part 300. Specifically, the main body part 100 is provided with a channel (not shown) for the circulation of a liquid cooling medium and an accommodation groove (not shown) located on an upper surface of the main body part 100. The sealing part is accommodated in the accommodation groove. The mounting part 300 is located above the sealing part, the lower surface of the mounting part 300 faces the main body part 100, and the upper surface of the mounting part 300 is used for mounting an electronic device to be cooled (e.g., a power electronic device 500).

The cold plate assembly for the electrical cabinet according to the present disclosure is provided with the main body part 100, the sealing part, and the mounting part 300. The main body part 100 is provided with the channel for the inflow, circulation, and outflow of the liquid cooling medium and the channel for placing the sealing part. The mounting part 300 is used for mounting the power electronic device 500. The main body part 100 can be made of one or more relatively inexpensive materials including aluminum, plastic, and other suitable materials, so that the cost of the main body part 100 is reduced when compared to existing cold plates.

Moreover, the channel for the circulation of the liquid cooling medium may be provided in the main body part 100, and those skilled in the art should understand that the liquid cooling medium may include, but is not limited to, ethylene glycol, propylene glycol, deionized water, an alcohol-type coolant, refrigerant, oil, another suitable liquid, or any combination thereof. In addition, a flow channel (not shown) may be formed in the surface of the main body part 100, and the flow channel can communicate with the channel via a liquid outlet and a liquid inlet.

Figure 1:
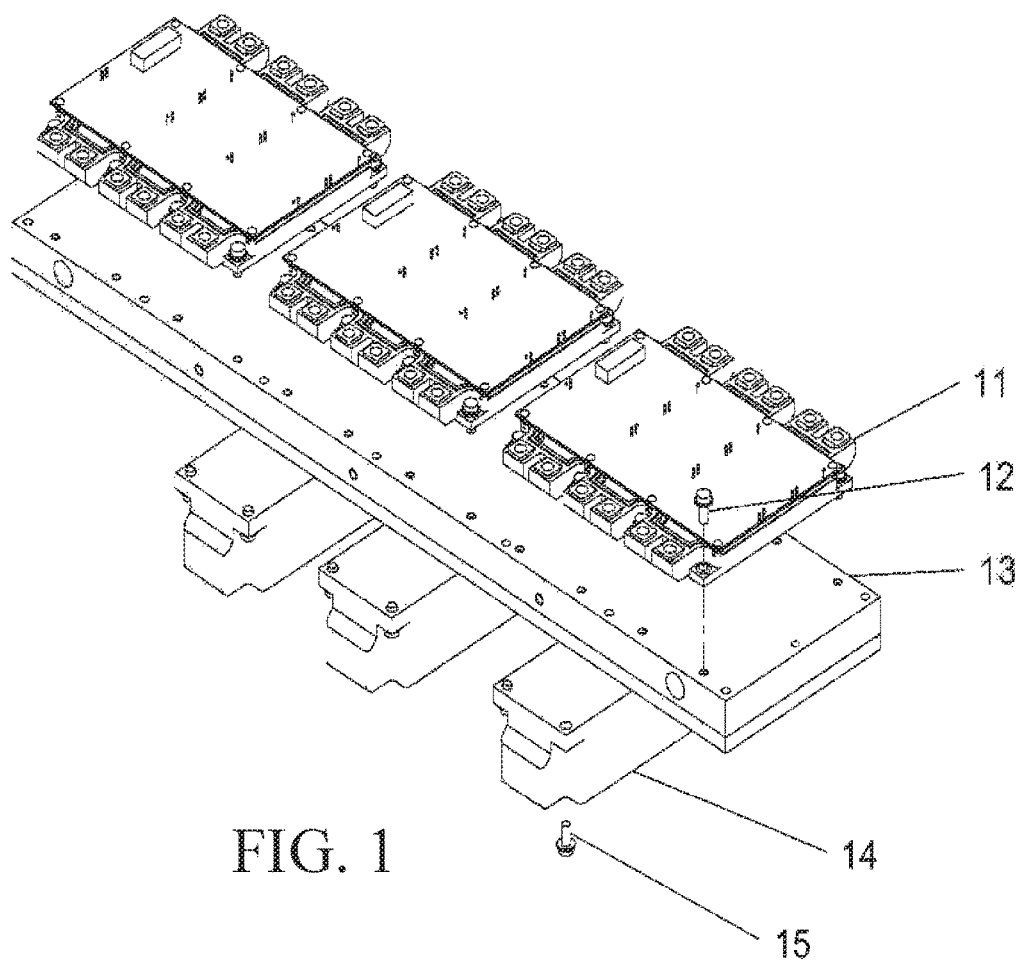
FIG. 1 is an exploded view of a cold plate in the prior art.
Figure 2:
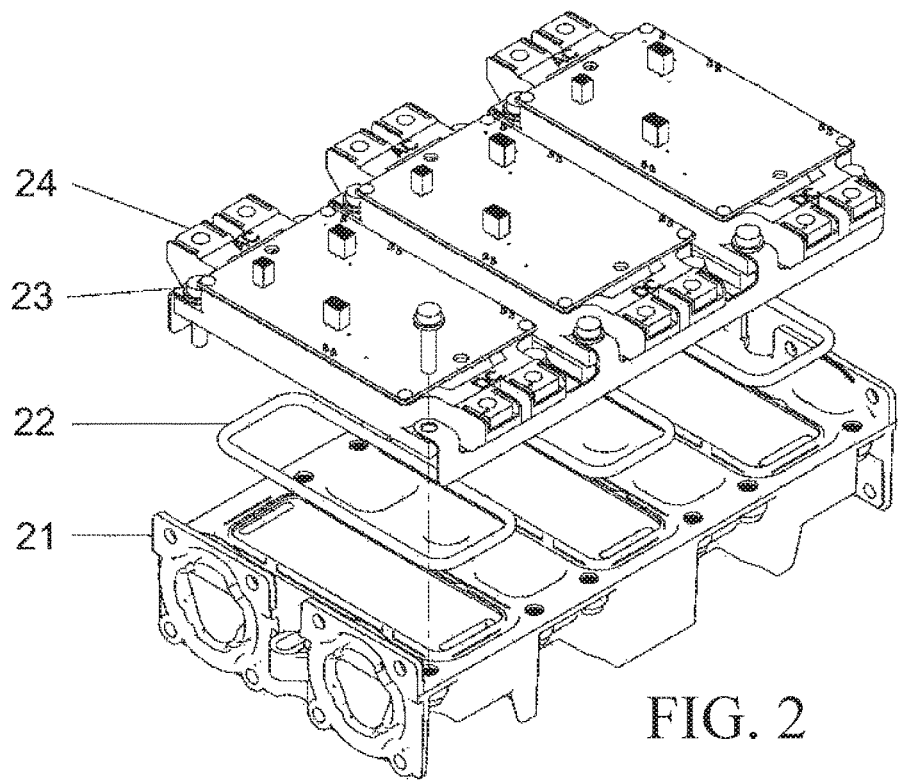
FIG. 2 is an exploded view of another cold plate in the prior art.
Figure 3:
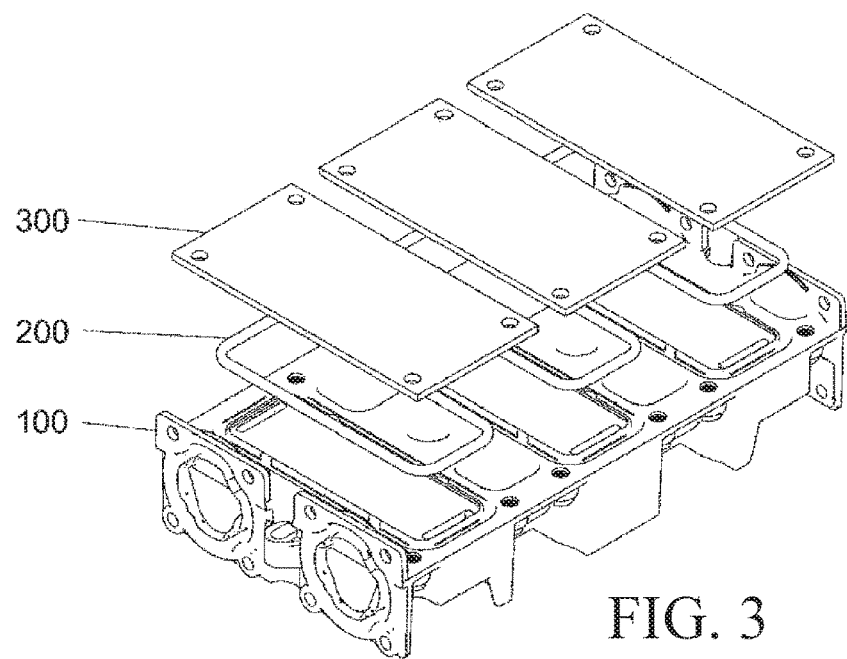
FIG. 3 is an exploded view of a cold plate assembly for an electrical cabinet according to a first embodiment of the utility model, in accordance with an aspect of the present disclosure.
Figure 4:
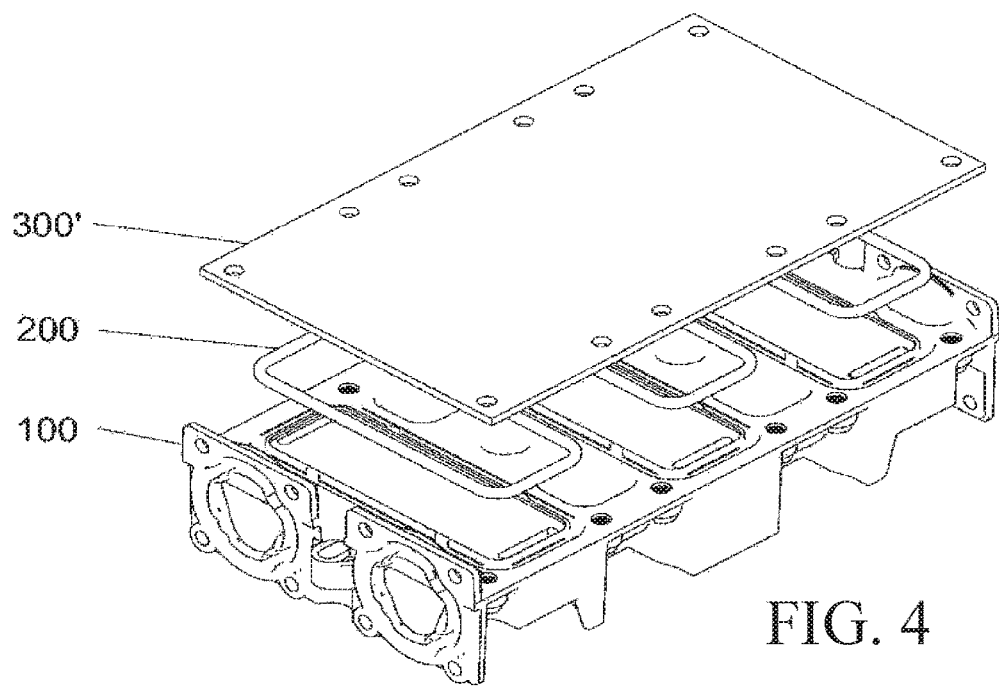
FIG. 4 is an exploded view of a cold plate assembly for an electrical cabinet according to a second embodiment of the utility model, in accordance with an aspect of the present disclosure.

As shown in the illustrated embodiments of FIGS. 3 and 4, the main body part 100 may be formed from a single piece of material, for example, a plate-like member. In other embodiments, the main body part 100 may also be formed and sealed by one or more pieces of material.

In addition, the liquid outlet, the flow channel, the liquid inlet, and the channel for placing a sealing ring 200 may be formed in different sizes depending on the power electronic device 500 and/or other factors (e.g., the type of cooling fluid, etc.).

In an embodiment, the sealing part includes at least one sealing ring 200, the number and size of the sealing rings can be determined according to the power electronic device 500 and/or other factors (e.g., the type of cooling fluid, etc.). For example, one sealing ring 200 or three sealing rings 200 may be provided depending on the power electronic device 500.

Figure 5:
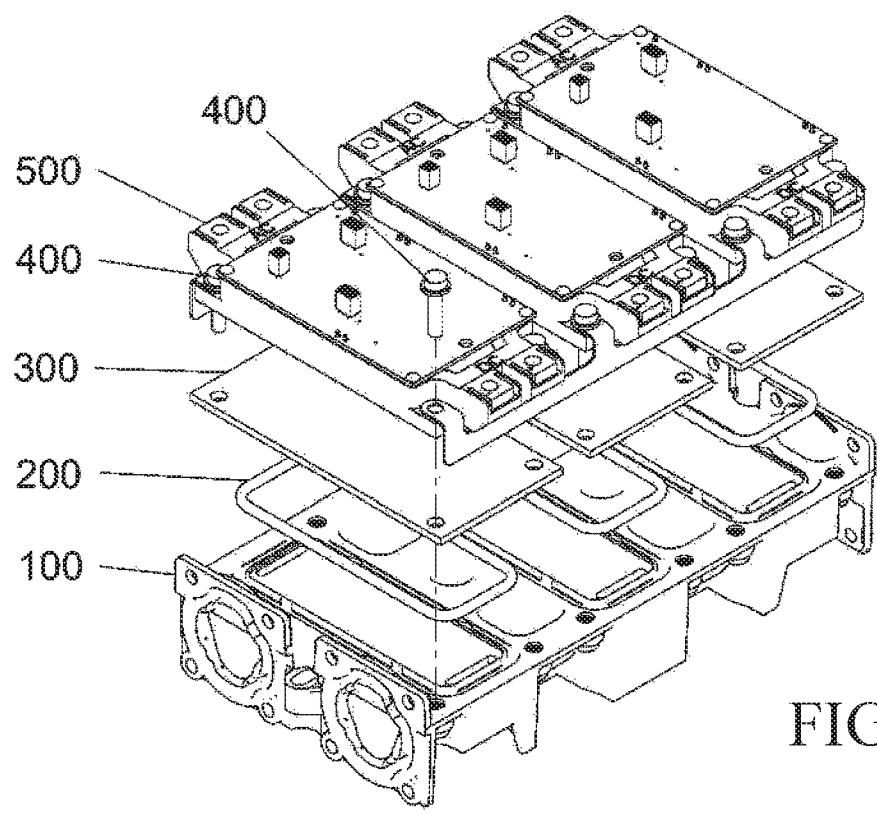
FIG. 5 is an exploded view of the cold plate assembly and a power electronic device shown in FIG. 3, in accordance with an aspect of the present disclosure.
Figure 6:
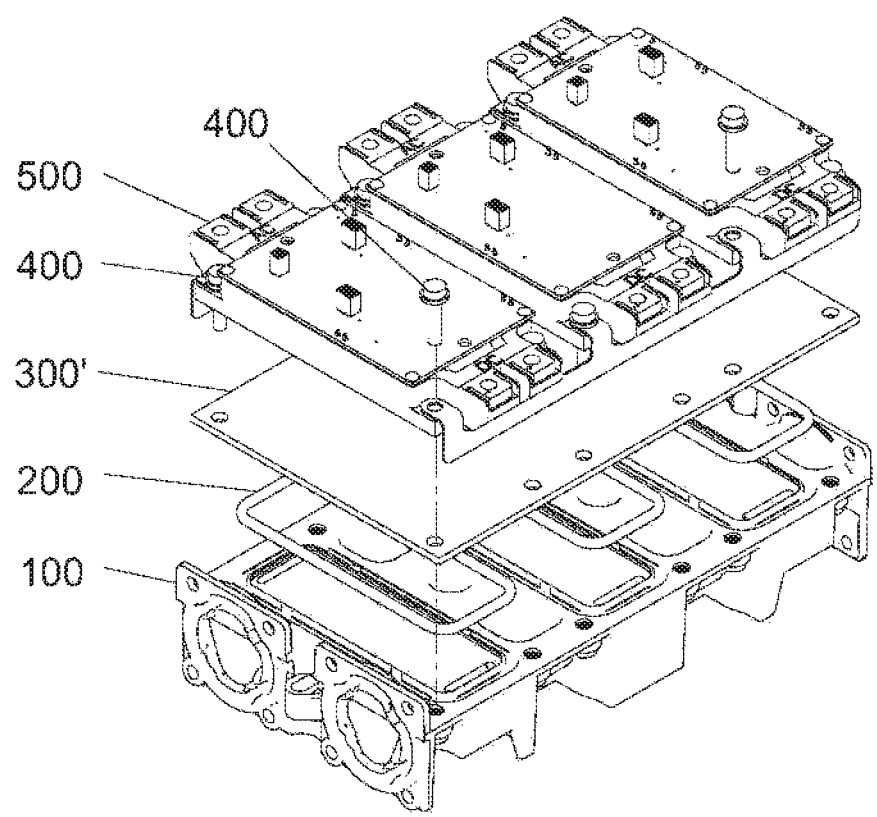
FIG. 6 is an exploded view of the cold plate assembly and the power electronic device shown in FIG. 4, in accordance with an aspect of the present disclosure.

The mounting part 300 may be formed by copper or other materials with having a relatively high thermal conductivity. Moreover, the mounting part 300 may be set as at least one plate-like member according to the size of the bottom substrate of the power electronic device 500. For example, as shown in the illustrated embodiment of FIG. 5, the mounting part 300 includes three plate-like members, while in other embodiments (see, e.g., FIGS. 4 and 6), the mounting part 300' includes one plate-like member.

In embodiments where the power electronic device 500 includes a bottom substrate that is an unsealed structure, the mounting part 300 may isolate the bottom substrate of the power electronic device 500 from the liquid cooling medium, such that embodiments of the cold plate assembly of the present disclosure may be suitable for the power electronic device 500 having a bottom substrate that is the unsealed structure.

Figure 7:
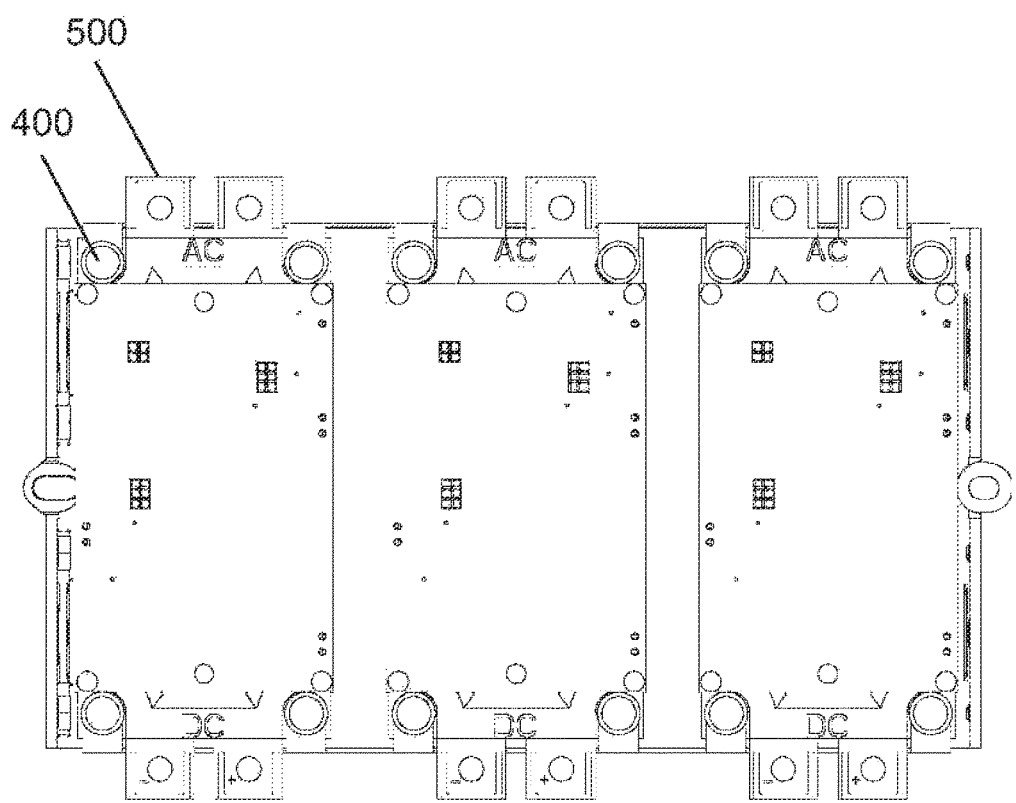
FIG. 7 is a top view of a cold plate assembly with a power electronic device mounted thereon, in accordance with an aspect of the present disclosure.
Figure 8:
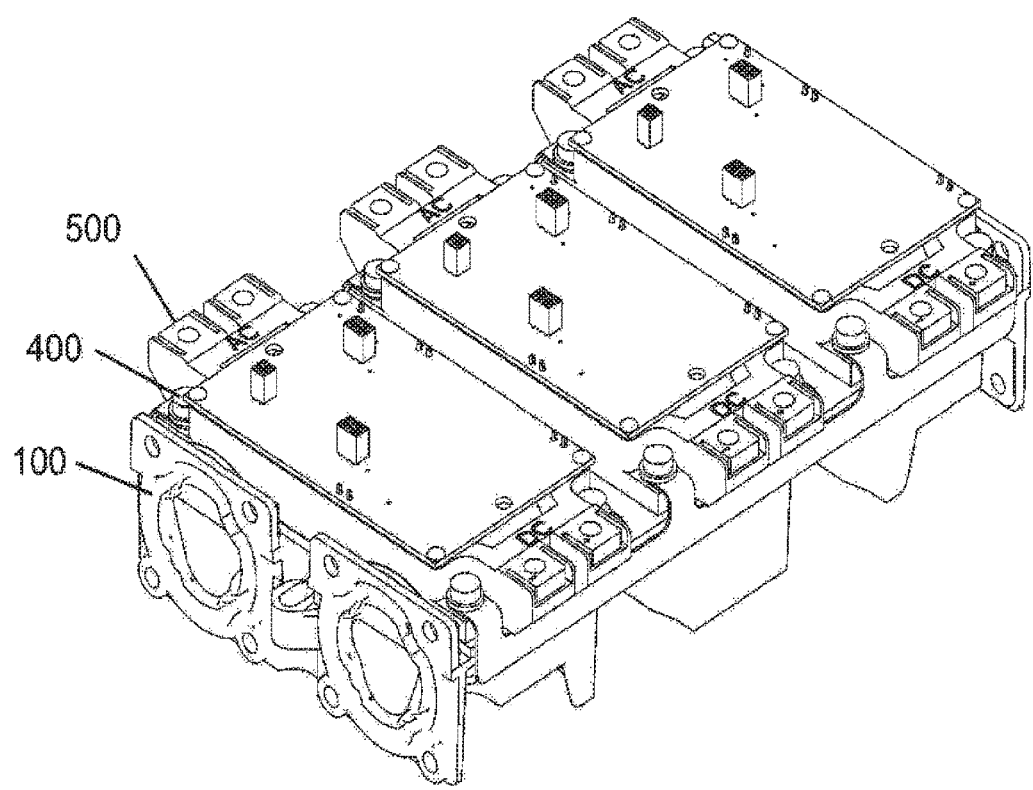
FIG. 8 is a perspective view of a cold plate assembly with a power electronic device mounted thereon, in accordance with an aspect of the present disclosure.

As shown in FIGS. 7 and 8, the mounting part 300 may be mounted on the main body part 100 using a fastener, such as a bolt 400 or other fastening means, in cooperation with the sealing ring 200. Additionally or alternatively, the power electronic device 500 and the sealing ring 200 may also be mounted on the main body part 100 through one common fastener.

When in use, the liquid cooling medium flows into the main body part 100, flows through the channel, flows out from the liquid outlet in the surface of the main body part 100, contacts the lower surface of the mounting part 300 via the flow channel, returns to the channel of the main body part 100 from the liquid inlet, and flows out from the main body part 100 along the channel to be cooled at the outside (e.g., by the heat exchanger). Therefore, when the liquid cooling medium contacts the lower surface of the mounting part 300, the liquid cooling medium may remove the heat generated by the power electronic device 500 mounted on the mounting part 300 so as to cool the power electronic device 500.

Unless otherwise defined, the technical and scientific terms used herein have the same meaning as commonly understood by those skilled in the art of the present disclosure. The terms used herein are for the purpose of describing the specific implementation and are not intended to limit the embodiments of the present disclosure. The terms such as "arrangement" and the like may express that a component is attached directly to another component or that a component is attached to another component through a middleware. The features described herein in one embodiment may be applied separately or in combination with other features to another embodiment unless the feature is not applicable or otherwise described in the other embodiment.

The present disclosure has been described by way of the above embodiments, but it should be understood that the above-mentioned embodiments are for exemplary and illustrative purposes only and are not intended to limit the present disclosure to the range of the described embodiments. It will be understood by those skilled in the art that various variations and modifications may be made in accordance with the teachings of the present disclosure, and these variations and modifications shall all fall within the protection scope of the present disclosure.

The invention claimed is:

1. A cold plate assembly for an electrical cabinet, comprising:
    a main body part comprising a plurality of channels and a plurality of accommodation grooves,
    wherein the plurality of channels is configured to circulate a liquid cooling medium,
    wherein the plurality of accommodation grooves is located on a first upper surface of the main body part,
    wherein the main body part comprises a liquid inlet and a liquid outlet fluidly coupled to the plurality of channels,
    wherein the liquid inlet and the liquid outlet are located on a side surface of the main body part that is crosswise to the first upper surface,
    and wherein the main body part is made of a material containing aluminum and plastic;
    a plurality of sealing parts,
    wherein each sealing part of the plurality of sealing parts is disposed in a corresponding accommodation groove of the plurality of accommodation grooves; and
    a plurality of mounting parts positioned above the plurality of sealing parts,
    wherein a lower surface of each mounting part of the plurality of mounting parts faces the main body part,
    a second upper surface of each mounting part of the plurality of mounting parts is configured to couple to a substrate of an electronic device to be cooled by the liquid cooling medium and to fluidly isolate the substrate from the liquid cooling medium,
    and wherein the plurality of mounting parts is made of copper.

2. The cold plate assembly of claim 1, wherein the main body part comprises at least one plate-like component.

3. The cold plate assembly of claim 1, wherein the plurality of mounting parts comprises at least one plate-like component.

4. The cold plate assembly of claim 1, wherein a sealing part of the plurality of sealing parts comprises at least one sealing ring.

5. The cold plate assembly of claim 1, wherein a flow channel is formed in the first upper surface of the main body part, and the flow channel is fluidly coupled with a channel of the plurality of channels.

* * * * *